US008760879B1

(12) United States Patent
Platt

(10) Patent No.: US 8,760,879 B1
(45) Date of Patent: Jun. 24, 2014

(54) GROUNDED PARTITIONING FOR A MULTIPLEXER

(75) Inventor: John Jeremy Churchill Platt, Grand Haven, MI (US)

(73) Assignee: R.A. Miller Industries, Inc., Grand Haven, MI (US)

( * ) Notice: Subject to any disclaimer, the term of this patent is extended or adjusted under 35 U.S.C. 154(b) by 217 days.

(21) Appl. No.: 13/422,675

(22) Filed: Mar. 16, 2012

Related U.S. Application Data

(60) Provisional application No. 61/475,830, filed on Apr. 15, 2011.

(51) Int. Cl.
| | |
|---|---|
| H05K 5/00 | (2006.01) |
| H05K 1/00 | (2006.01) |
| H05K 1/18 | (2006.01) |
| H05K 7/00 | (2006.01) |

(52) U.S. Cl.
USPC ....... 361/752; 361/748; 361/679.01; 361/600

(58) Field of Classification Search
CPC ... H01R 13/447; H05K 7/1409; H05K 7/142; H05K 3/284; H05K 1/141; G06F 1/184; G06F 1/185; G06F 1/186; G06F 1/181; G06F 1/1616; G06F 1/1656; H02B 1/28; H02B 1/056; H02B 1/32
USPC ................... 361/759, 752, 748, 679.01, 600; 174/50, 17 R, 58, 60, 63, 64, 559; 370/342; 385/136, 137; 439/535; 248/906; 220/4.02
See application file for complete search history.

(56) References Cited

U.S. PATENT DOCUMENTS

| | | | | |
|---|---|---|---|---|
| 5,414,597 | A  * | 5/1995 | Lindland et al. | 361/816 |
| 6,116,916 | A  * | 9/2000 | Kasai | 439/76.2 |
| 6,430,054 | B1 * | 8/2002 | Iwata | 361/752 |
| 6,775,457 | B2 | 8/2004 | Loh | |
| 7,397,670 | B2 * | 7/2008 | Su | 361/752 |
| 2010/0254366 | A1 | 10/2010 | Shu et al. | |

FOREIGN PATENT DOCUMENTS

| | | |
|---|---|---|
| CN | 101888009 A | 11/2010 |
| JP | 9232910 A | 9/1997 |
| JP | 2010177559 A | 8/2010 |

* cited by examiner

*Primary Examiner* — Jenny L Wagner
*Assistant Examiner* — Ahmad D Barnes
(74) *Attorney, Agent, or Firm* — McGarry Bair PC

(57) ABSTRACT

The present invention provides a box-type housing for a multiplexer having a generally flat base plate, a circuit board disposed on the base plate, and at least one partition member arranged on top the circuit board to isolate components of the circuit board and to mechanically secure the circuit board to the base plate. The invention also provides a method of isolating components of a circuit board in a box-type housing for a multiplexer and a method of providing a ground connection to a base plate of a box-type housing for a multiplexer.

12 Claims, 4 Drawing Sheets

GROUNDED PARTITIONING FOR A MULTIPLEXER

CROSS-REFERENCE TO RELATED APPLICATION

This application claims the benefit of U.S. Application Ser. No. 61/475,830, filed Apr. 15, 2011.

BACKGROUND OF THE INVENTION

With a rapid development of telecommunications, there has been an increased interest in developing various multiplexer circuits and packaging. Different designs of a multiplexer housing have been developed to accommodate the multiplexer into an environment of a particular application. Box-type housings for a multiplexer are designed to protect the multiplexer from an outside environment and to improve general performance of the multiplexer. For example, it is known to include one or more partitions to a multiplexer housing to help isolate portions of a multiplexer circuit from each other and/or to minimize interference between signals. One conventional way of partitioning a multiplexer housing is by milling out a cavity in the housing, the cavity being shaped for a specific circuit design. The partitions in this case are made as an integral part of the housing. Another conventional way is to mount the partitions to the housing prior to installation of a circuit board.

SUMMARY OF THE INVENTION

In one embodiment of the invention, a grounded partitioning for a multiplexer includes a base body having a generally flat base plate, and a circuit board disposed on the base plate. The circuit board has one or more conductive grounding traces. One or more partition members is arranged on top of the circuit board, and one or more conductive fasteners secures the partition member to the base plate through the circuit board with the conductive grounding trace sandwiched between the partition member and the base plate. The conductive grounding trace is electrically connected to the base plate, and the partition member isolates components of the circuit board from other components of the circuit board.

In another aspect of the invention, a method of providing a ground connection to a base plate of a box-type housing for a multiplexer having a circuit board with a grounding trace disposed on the base plate includes disposing at one or more partition members on top of the circuit board and the grounding trace, providing the circuit board with one or more openings corresponding to the location of the partition member, and providing an electrical connection between the partition member and the grounding trace.

DESCRIPTION OF EMBODIMENTS OF THE INVENTION

Figure 1:
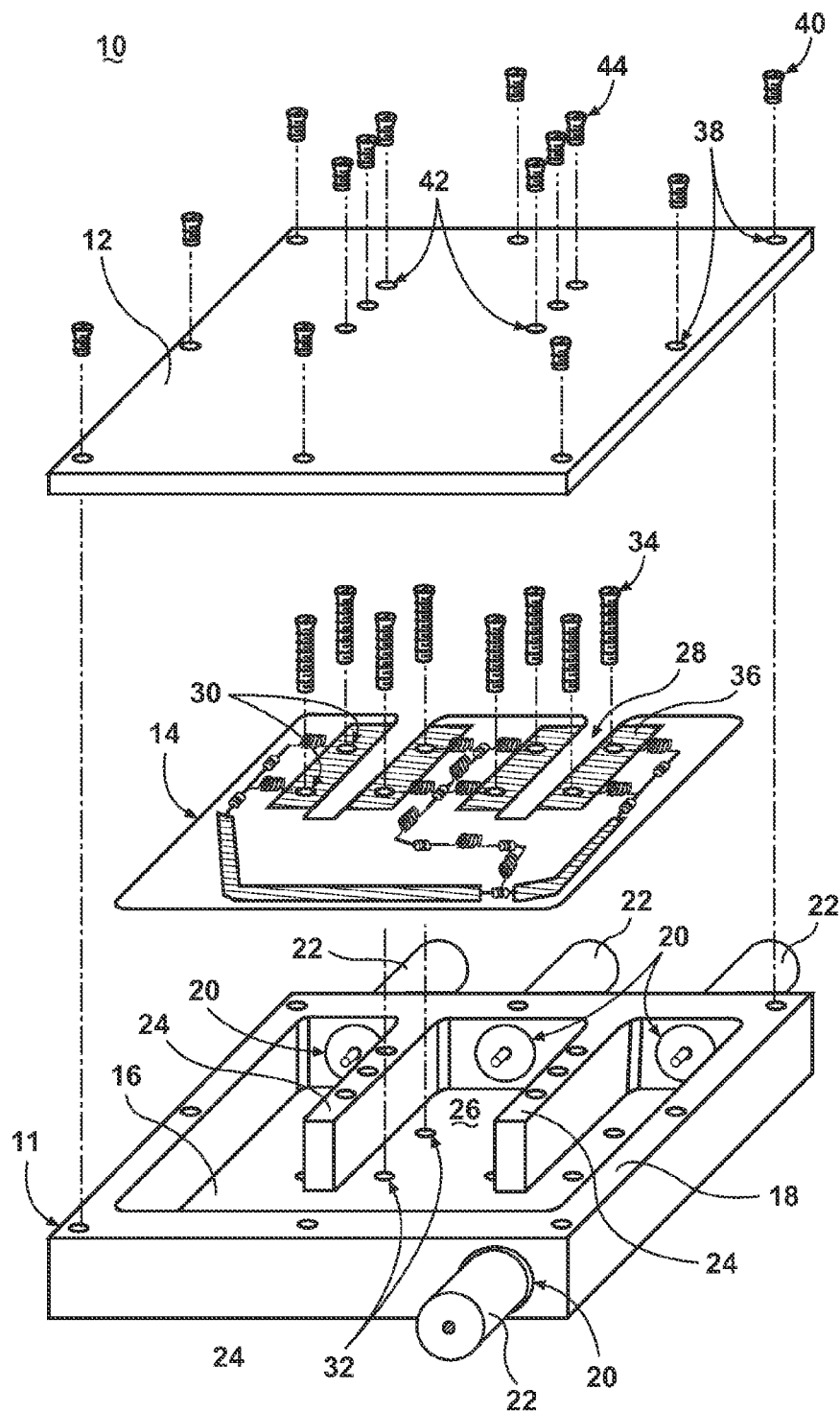
FIG. 1 is an exploded view of a prior art box-type multiplexer unit.

Looking first at FIG. 1, there is shown an exploded view of a prior art box-type multiplexer unit 10. The unit includes a base body 11 and a cover 12 encapsulating a multiplexer circuit board 14. The base body 10 has a generally flat base plate 16 surrounded by a wall 18. The wall 18 can have a desired number of connection openings 20; each opening 20 can have a corresponding number of built-in cable attachments 22. The base body also includes a desired number of partitions 24 integrated into the flat base plate 16 and/or the wall 18. The partitions 24 can be made by milling out a cavity 26 in the housing body 10, shaping the cavity 26 for a specific circuit board design. Alternatively, the partitions 24 can be mounted to the flat base 16 prior to installation of a circuit board 14.

The circuit board 14 includes a number of cutouts 28 corresponding to locations of the partitions 24. Thus, the shape of the circuit board 14 conforms to the shape of the cavity 26 of the base body 10. The circuit board 14 is provided with holes 30 and the flat base plate 16 is provided with corresponding holes 32 for securing the circuit board 14 to the flat base plate 16 by screws 34. The circuit board can also have copper trace area 36 to assist in grounding the circuit components. It can be noted, that a relatively large area of the circuit board 14 is taken by the cutouts 28 and the by the areas 36 taken for attachment and grounding purposes. Although it may be implied, it could be noted that base plate 16 acts as a ground substrate for the circuit board 14 relative to the traces and circuit, and is electrically connected to the copper traces 36.

The cover 12 can be provided with holes 38 for securing the cover 12 to the wall 18 by screws 40. The cover 12 can also be provided with holes 42 for securing the cover 12 to the partitions 24 by screws 44.

Figure 2:
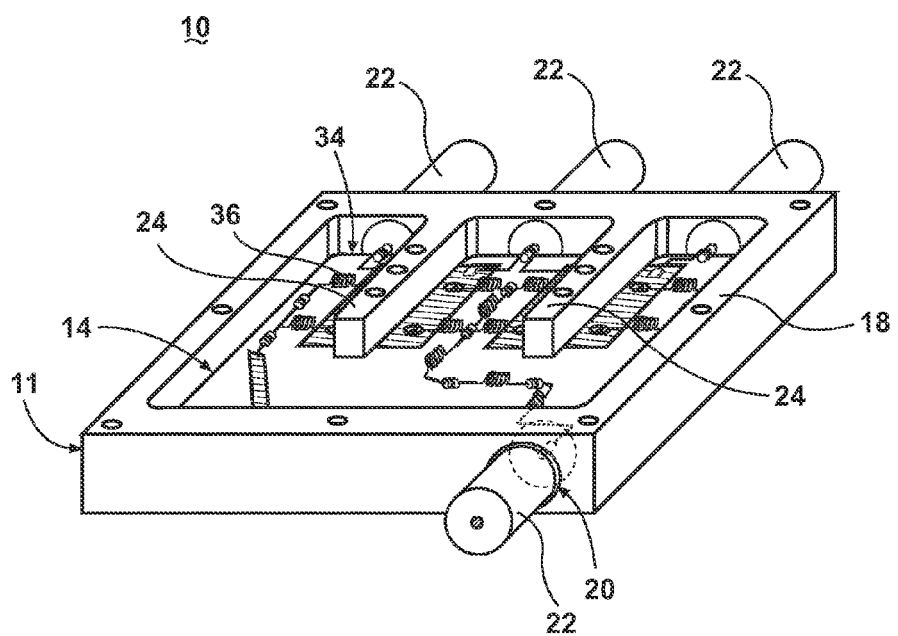
FIG. 2 is a perspective view of the assembled box-type unit of FIG. 1 with a cover removed.

An assembly of the multiplexer unit 10 is carried on in a following order: (a) the base body 11 is partitioned by one of the conventional methods described above; (b) the circuit board 14 is placed and secured to the flat base plate 16; (c) the cover 12 is secured to the wall 18 and to the partitions 24. FIG. 2 shows a perspective view of the assembled box-type multiplexer unit 10 with the steps (a) and (b) carried out. Circuit traces 36 are attached to the center contact of the built-in cable attachments 22 via brass pegs or bus wire, etc.

Figure 3:
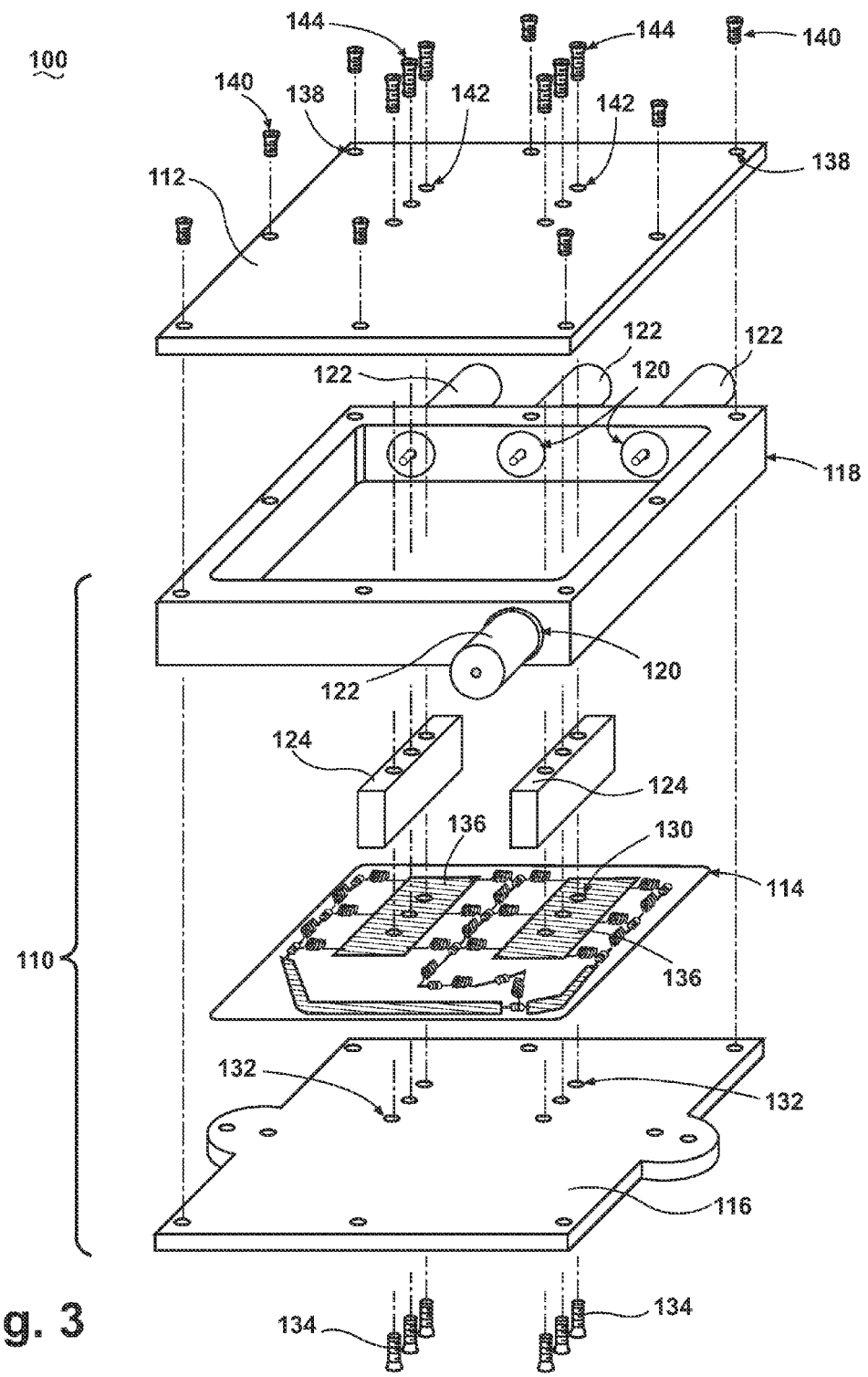
FIG. 3 an exploded view of a box-type multiplexer unit according to a first embodiment of the present invention.

Turning now to FIG. 3, there is shown an exploded view of a box-type multiplexer unit 100 according to a first embodiment of the present invention. The elements of the first embodiment of the present invention which are similar to the elements of the prior art box-type a multiplexer unit 10 will be numbered with the prefix 100. The unit 100 includes a base body 110 and an optional cover 112 encapsulating a multiplexer circuit board 114. The base body 110 has a generally flat base plate 116 and an optional wall member 118. The base plate 116 and the wall member 118 may be made as two separate elements or may be made as single-piece defining the base body 110. The optional wall member 118 may have a desired number of connection openings 120; each opening 120 can have a corresponding number of built-in or removable cable attachments 122.

The circuit board 114 may be provided with holes 130 and the flat base plate 116 is provided with corresponding holes 132 for securing the circuit board 114 to the flat base plate 116 by screws 134. The circuit board may also have one or more copper trace area 136 to assist in grounding the circuit components as discussed below in further details. It can be noted, that a smaller area of the circuit board 116 is taken by the area(s) 136 taken for attachment and grounding purposes as compared to the circuit board 16 of FIG. 1. Thus, the invention saves the circuit board space and/or enables to decrease overall size of the unit 100.

The multiplexer circuit details are not germane to the present invention and, therefore, are omitted. Any type of a multiplexer (for example, a diplexer, a triplexer, a quartoplexer, etc.) can be used in conjunction with the present invention. The invention also places no restrictions on an intended use of the multiplexer. One example of an intended use may be to split one antenna port into multiple bands for attachment to transceivers (and/or receivers, transmitters, radios, etc.) via cable attachments. Alternatively, it may connect one radio to multiple antennas via cable attachments 122.

In the present invention, a desired number of partition members 124 can be made separately from the flat base plate 116 and/or the wall member 118. For example, the partition members 124 can be made by extrusion and/or cut from flat stock. Similarly, the base plate 116 and wall member 118 may also be made by extrusion and/or cut from flat stock. As well, the wall member 118 can be made integral with the partitions 124 by extrusion. Although it may be implied, it could be noted that base plate 116 acts as a ground substrate for the circuit board 114 relative to the traces and circuit, and is electrically connected to traces 136 via screws 134 and the partition members 124.

The optional cover 112 can be provided with holes 138 for securing the cover 112 to the optional wall member 118 by screws 140. The optional cover 112 can also be provided with holes 142 for securing the cover 112 to the partition members 124 by screws 144. The cover 112 may be beneficial for a rugged environment and/or for a semi-permanent installation/handling of the unit 100. The screws 144 may provide additional grounding and/or isolation between circuit compartments.

Figure 4:
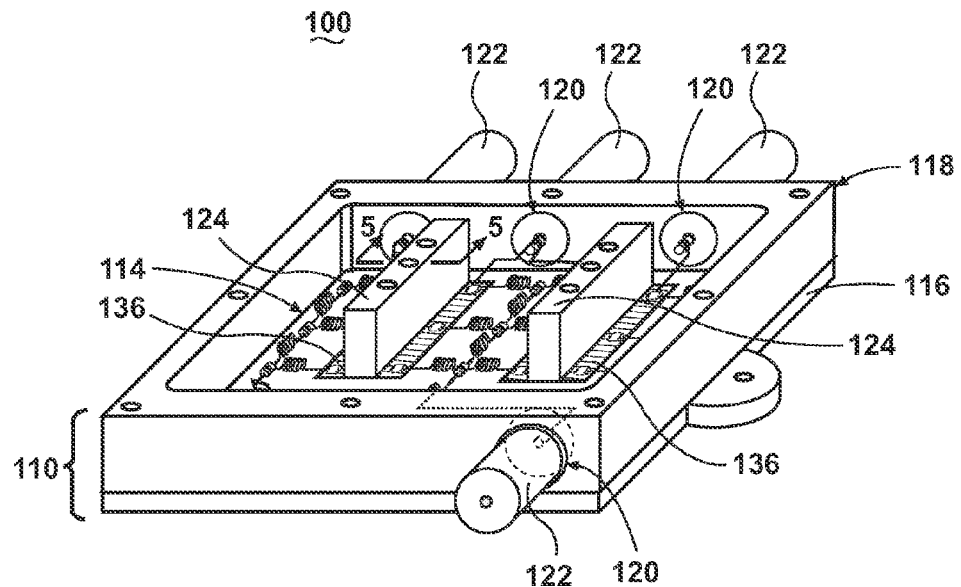
FIG. 4 is a perspective view of the assembled box-type unit of FIG. 3 with a cover removed.

An assembly of the multiplexer unit 100 may be carried on as follows: (I) provide the base plate 116; (II) place the circuit board 114 on top of the base plate 116; (III) place the partition members 124 on top of the circuit board 114; (IV) secure the partition members 124 and the circuit board 114 to the base plate 116 by one or more mechanical fastener; (V) secure the optional wall member 118 to the base plate 116; (VI) secure the optional cover 112 to the wall member 118 and/or to the partition members 124. FIG. 4 shows a perspective view of the assembled box-type multiplexer unit 100 without the cover 112. It should be noted, that the step (V) may be carried out before any of the steps: (II), (III) or (IV). If the wall member 118 were formed integrally with the partition members 124, then steps IV and V can be combined where the wall member 118 and partitions members 124 are secured to the base plate 116 with the circuit board 114 sandwiched between them.

Figure 5:
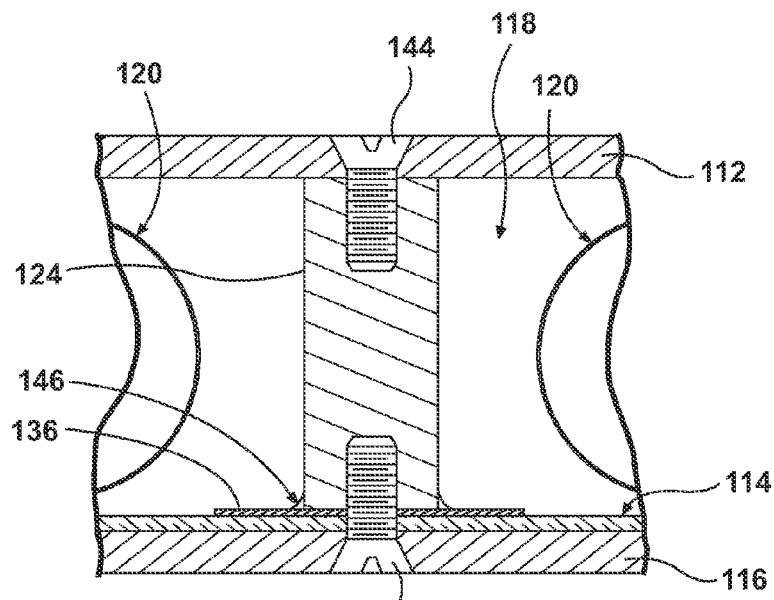
FIG. 5 a partial enlarged cross sectional view of FIG. 4 taken along a line 5-5.

The partition members 124 also enable to provide a ground connection to the base plate 116, by sandwiching the copper trace 136 between the base plate 116 and the partition members 124 by screws 134 as shown in FIG. 5. The partition members 124 also may connect to the top plate 112 via screws 144 connecting the base plate 116 to the cover 112, creating additional Faraday cage effects. FIG. 5 demonstrates a partial enlarged cross sectional view of FIG. 4 taken along line 5-5.

Depending on a material used, it may be possible to directly attach the circuit board 114 to the partition members 124 by using an optional solder 146. Some examples of a suitable material include, but are not limited to brass, tin and silver. The partition members 124 may be plated by the brass, tin or silver, or made entirely from the brass tin or silver. Soldering the partition members 124 and the circuit board 114 not only improves an electrical connection between them, but also increases the reliability of the whole assembly 100.

The partition members 124 described above create a nearly complete separation between components of the multiplexer (such as filters) and a partial "Faraday Effect", thus creating an electrical cavity. This prevents electrical "cross talk" between the circuit filters and enhances isolation.

The invention provides a novel method of isolating portions of circuits of the circuit board 114, the method including: placing the circuit board 116 on top of the base plate 116, disposing at least one partition member 124 on top of the circuit board 116 and securing the circuit board 116 between the at least one partition member 124 and the base plate 116.

The invention also teaches a novel method of providing a ground connection to the base plate 116 of a box-type housing for a multiplexer 100 having a circuit board 114 disposed on the base plate 116. The method includes: disposing at least one partition member 124 on top of the circuit board 116, providing the circuit board with at least one opening 130 corresponding to the location of the at least one partition member 124 and providing electrical connection between the at least one partition member 124 and the base plate 116.

While the illustrated design shows two partition members 124, it will be understood, that any number of the partition members 124 may be implemented depending on specifics of each multiplexer. For example, a diplexer will have only one partition member, a triplexer will have two partition members (as illustrated), a quartoplexer will have three partition members, etc. Moreover, all partition members 124 can be made as one single piece of a desired shape instead of multiple separate partition members 124. In this alternative embodiment, the single piece partitioning will be handled in a similar way as the two partition members 124 described above.

Materials used to make the base body 110 and the partitioning 124 may be of a conventional type, or varied in accordance with a desired benefit. The inventive concept of the partitioning done as a separate element(s) 124 allows for the partition member(s) 124 to be made of a different material than the base body 110. For example, the partition member(s) 124 may be made of brass or plated with brass which allows direct solder connections to the circuit board 114 and/or circuit board components while the base body 110 may be made of aluminum (i.e. cannot solder to). This example enables to reduce the overall weight of the packaged multiplexer, without affecting an overall performance.

While the illustrated design shows a screw type connection used for securing the partition members 124, circuit board 114 and the base plate 116, other type of connections may be used to in conjunction with the present invention, such as rivets, or other conductive fasteners. One alternative embodiment may include providing the partition members 124 with at least one threaded connection (not shown) instead of affixing by the screws 134. In this embodiment, the at least one threaded connection (such as a threaded pin) would secure the circuit board 114 to the base plate 116 via at least one corresponding opening 130 in the circuit board.

The proposed box-type multiplexer unit 100 may be implemented for any application of the multiplexer. It may be particularly beneficial for use in any ruggedized environment where a special handling is required (e.g., military field antenna/radio connection). In this case, the optional cover 112 and the wall member 118 may need to be used. The invention may also be implemented in a semi-permanent installation as a radio or antenna in an aircraft, a vehicle, or a marine/ship. Additionally or alternatively, the unit 100 can be made waterproof and/or gas-proof which may require usage of additional elements such as a water/gas sealing gasket (not shown).

The proposed invention minimizes (or even completely omits) milling time which leads to reducing cost of manufacturing and reducing the use of materials. Also, the inventive concept of the partitioning done as a separate element(s) 124 added after installation of the circuit board 116 enables a greater flexibility in assembly of the entire multiplexer packaging. For example, the same base body 110 may be used for different circuit designs and shapes. This cannot be achieved in a conventional multiplexer unit 10. Lastly, as mentioned above, by decreasing the area of the circuit board 136 needed for attachment and grounding purposes, the invention leaves room for additional circuit board components or enables to decrease overall size of the unit 100.

While the invention has been specifically described in connection with certain specific embodiments thereof, it is to be understood that this is by way of illustration and not of limitation, and the scope of the appended claims should be construed as broadly as the prior art will permit.

What is claimed is:

1. A grounded partitioning for a multiplexer comprising: a base body having a generally flat base plate, a circuit board disposed on the base plate and having at least one conductive grounding trace, at least one partition member arranged on top of the circuit board, and at least one conductive fastener securing the at least one partition member to the base plate through the circuit board and the at least one conductive grounding trace sandwiched between the at least one partition member and the base plate, wherein the at least one conductive grounding trace is electrically connected to the base plate and the at least one partition member isolates components of the circuit board from other components of the circuit board.

2. The grounded partitioning of claim 1, wherein the at least one conductive fastener provides the electrical connection between the at least one conductive grounding trace and the base plate.

3. The grounded partitioning of claim 1, wherein the at least one conductive fastener is a mechanical fastener to mechanically secure the circuit board to the base plate.

4. The grounded partitioning of claim 1, wherein the base body further comprising a generally rectangular base wall member disposed on the base plate to define a cavity housing the circuit board.

5. The grounded partitioning of claim 4, further comprising a cover attached to at least one of the at least one partition member and the base wall member.

6. The grounded partitioning of claim 1, further comprising a cover attached to the at least one partition member.

7. The grounded partitioning of claim 1 wherein the at least one partition member and the base body are made of conductive material.

8. The grounded partitioning of claim 7 wherein the at least one partition member is made of a different conductive material than the base body.

9. The grounded partitioning of claim 8 wherein the at least one partition member is made of brass and the base body is made of aluminum.

10. The grounded partitioning of claim 1 wherein the at least one partition member is soldered to the circuit board.

11. A method of isolating components of a circuit board in a box-type housing for a multiplexer having a base body with a generally flat base plate, the method comprising: placing the circuit board on top of the base plate, disposing at least one partition member on top of the circuit board and securing the circuit board between the at least one partition member and the base plate by at least one conductive fastener through the circuit board.

12. A method of providing a ground connection to a base plate of a box-type housing for a multiplexer having a circuit board with a grounding trace disposed on the base plate, the method comprising disposing at least one partition member on top of the circuit board and the grounding trace, providing the circuit board with at least one opening corresponding to the location of the at least one partition member and providing an electrical connection between the at least one partition member and the grounding trace.

\* \* \* \* \*